United States Patent
Ahn

(10) Patent No.: US 8,802,481 B2
(45) Date of Patent: Aug. 12, 2014

(54) PHOTODETECTOR CAPABLE OF DETECTING THE VISIBLE LIGHT SPECTRUM

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 80 days.

(21) Appl. No.: 13/485,241

(22) Filed: May 31, 2012

(65) Prior Publication Data

US 2012/0235028 A1 Sep. 20, 2012

Related U.S. Application Data

(63) Continuation of application No. 12/498,204, filed on Jul. 6, 2009, now Pat. No. 8,227,793.

(51) Int. Cl.
*H01L 21/00* (2006.01)

(52) U.S. Cl.
USPC .................................. 438/69; 257/21; 257/257

(58) Field of Classification Search
CPC .............. H01L 31/0232; H01L 31/112; H01L 31/1126
USPC .................................................. 257/21, 257
See application file for complete search history.

(56) References Cited

U.S. PATENT DOCUMENTS

| | | | |
|---|---|---|---|
| 3,920,860 A | 11/1975 | Freller et al. | |
| 3,990,096 A | 11/1976 | Namizaki et al. | |
| 4,764,261 A | 8/1988 | Ondris et al. | |
| 5,079,774 A | 1/1992 | Mendez et al. | |
| 5,112,410 A | 5/1992 | Chen | |
| 5,175,739 A | 12/1992 | Takeuchi et al. | |
| 5,181,219 A | 1/1993 | Mori et al. | |
| 5,181,221 A | 1/1993 | Mori et al. | |
| 5,182,757 A | 1/1993 | Mori et al. | |
| 5,287,377 A | 2/1994 | Fukuzawa et al. | |
| 5,291,506 A | 3/1994 | Ahn et al. | |
| 5,291,507 A | 3/1994 | Haase et al. | |
| 5,295,148 A | 3/1994 | Mori et al. | |
| 5,317,584 A | 5/1994 | Mori et al. | |
| 5,349,464 A | 9/1994 | Ishihara et al. | |
| 5,404,027 A | 4/1995 | Haase et al. | |
| 5,404,369 A | 4/1995 | Mori et al. | |
| 5,490,953 A | 2/1996 | Morita | |
| 5,563,902 A | 10/1996 | Xu et al. | |
| 5,576,221 A | 11/1996 | Takemura et al. | |
| 5,606,176 A | 2/1997 | Nitta | |
| 5,646,419 A | 7/1997 | McCaldin et al. | |
| 5,818,072 A | 10/1998 | Schetzina | |

(Continued)

FOREIGN PATENT DOCUMENTS

| | | |
|---|---|---|
| CN | 101405866 A | 4/2009 |
| JP | S61218194 A | 9/1986 |

(Continued)

OTHER PUBLICATIONS

U.S. Appl. No. 12/493,800, Jan. 20, 2012, Office Action.

(Continued)

*Primary Examiner* — Daniel Whalen
(74) *Attorney, Agent, or Firm* — Workman Nydegger

(57) ABSTRACT

Apparatuses capable of and techniques for detecting the visible light spectrum are provided.

20 Claims, 11 Drawing Sheets

(56) References Cited

U.S. PATENT DOCUMENTS

| | | | |
|---|---|---|---|
| 5,933,444 | A | 8/1999 | Molva et al. |
| 6,069,380 | A | 5/2000 | Chou et al. |
| 6,501,783 | B1 | 12/2002 | Capasso et al. |
| 6,515,313 | B1 | 2/2003 | Ibbetson et al. |
| 6,627,914 | B1 | 9/2003 | Komiyama et al. |
| 6,713,832 | B2 | 3/2004 | Pardo et al. |
| 6,798,552 | B2 | 9/2004 | Tada |
| 6,803,596 | B2 | 10/2004 | Hata |
| 6,813,063 | B2 | 11/2004 | Ishihara |
| 6,891,329 | B2 | 5/2005 | Nagano et al. |
| 6,956,808 | B2 | 10/2005 | Miyanishi et al. |
| 7,420,225 | B1 | 9/2008 | Wanke et al. |
| 7,638,817 | B2 | 12/2009 | Shur et al. |
| 7,656,928 | B2 | 2/2010 | Furuyama |
| 8,086,108 | B2 | 12/2011 | Tanigawa et al. |
| 8,183,656 | B2 | 5/2012 | Okamoto et al. |
| 8,227,793 | B2 | 7/2012 | Ahn |
| 8,369,370 | B2 | 2/2013 | Lell et al. |
| 8,373,153 | B2 | 2/2013 | Ahn |
| 2002/0031153 | A1 | 3/2002 | Niwa et al. |
| 2002/0150135 | A1 | 10/2002 | Naone et al. |
| 2004/0058467 | A1 | 3/2004 | Chirovsky et al. |
| 2004/0095978 | A1 | 5/2004 | Cheng et al. |
| 2004/0183087 | A1 | 9/2004 | Gardner |
| 2004/0232412 | A1 | 11/2004 | Burgener, II et al. |
| 2005/0074576 | A1 | 4/2005 | Chaiken et al. |
| 2005/0185686 | A1 | 8/2005 | Rupasov et al. |
| 2005/0285128 | A1 | 12/2005 | Scherer et al. |
| 2006/0244003 | A1 | 11/2006 | Ueda |
| 2007/0063304 | A1 | 3/2007 | Matsumoto et al. |
| 2007/0126021 | A1 | 6/2007 | Ryu et al. |
| 2007/0126037 | A1 | 6/2007 | Ikeda |
| 2007/0194297 | A1 | 8/2007 | McCarthy et al. |
| 2007/0298551 | A1 | 12/2007 | Bouvet et al. |
| 2008/0048193 | A1 | 2/2008 | Yoo et al. |
| 2008/0197366 | A1 | 8/2008 | Yoo et al. |
| 2009/0017268 | A1 | 1/2009 | Skipor et al. |
| 2009/0020149 | A1 | 1/2009 | Woods et al. |
| 2009/0114940 | A1 | 5/2009 | Yang et al. |
| 2009/0121628 | A1 | 5/2009 | Cho et al. |
| 2009/0273820 | A1 | 11/2009 | Dionne et al. |
| 2009/0310640 | A1 | 12/2009 | Sato et al. |
| 2010/0096001 | A1 | 4/2010 | Sivananthan et al. |
| 2010/0155696 | A1* | 6/2010 | Duan et al. ............ 257/14 |
| 2010/0261338 | A1 | 10/2010 | Tsakalakos et al. |
| 2010/0276661 | A1 | 11/2010 | Ahn |
| 2010/0301308 | A1 | 12/2010 | Ahn |
| 2010/0301454 | A1 | 12/2010 | Zhang et al. |
| 2010/0326489 | A1 | 12/2010 | Ahn |
| 2011/0001121 | A1 | 1/2011 | Ahn |
| 2011/0001122 | A1 | 1/2011 | Ahn |
| 2011/0001124 | A1 | 1/2011 | Ahn |
| 2011/0001125 | A1* | 1/2011 | Ahn ............ 257/14 |
| 2011/0043884 | A1 | 2/2011 | Ahn |
| 2011/0095309 | A1 | 4/2011 | Ahn |
| 2011/0114995 | A1 | 5/2011 | Ahn |
| 2012/0040483 | A1 | 2/2012 | Ahn |
| 2013/0141770 | A1 | 6/2013 | Ahn |

FOREIGN PATENT DOCUMENTS

| | | |
|---|---|---|
| JP | H0410669 A | 1/1992 |
| JP | H0572584 A | 3/1993 |
| JP | H05235488 A | 9/1993 |
| JP | H0613487 A | 1/1994 |
| JP | H07202340 A | 8/1995 |
| JP | H07231113 A | 8/1995 |
| JP | 09199783 | 7/1997 |
| JP | H10215029 A | 8/1998 |
| JP | H10303452 A | 11/1998 |
| JP | 2001291929 A | 10/2001 |
| JP | 2003092455 A | 3/2003 |
| JP | 2003520438 A | 7/2003 |
| JP | 2004140113 A | 5/2004 |
| JP | 2006210620 A | 8/2006 |
| JP | 2006344673 A | 12/2006 |
| JP | 07202340 | 8/2007 |
| JP | 2008056511 A | 3/2008 |
| JP | 2008171835 A | 7/2008 |
| JP | 200932770 A | 2/2009 |
| JP | 2011507289 A | 3/2011 |
| JP | 2012528481 A | 11/2012 |
| WO | 2008072688 A1 | 6/2008 |
| WO | WO 2009067347 | 5/2009 |
| WO | 2009080012 A1 | 7/2009 |
| WO | WO 2009106583 | 9/2009 |
| WO | WO2009106583 | 9/2009 |
| WO | WO 2010137865 | 12/2010 |
| WO | WO 2011004990 | 1/2011 |

OTHER PUBLICATIONS

U.S. Appl. No. 12/493,800, Apr. 26, 2012, Office Action.
U.S. Appl. No. 12/498,265, Aug. 17, 2012, Office Action.
U.S. Appl. No. 12/498,204, Jul. 4, 2012, Issue Notification.
U.S. Appl. No. 12/498,257, Jul. 3, 2012, Office Action.
U.S. Appl. No. 12/545,678, Dec. 16, 2011, Office Action.
U.S. Appl. No. 12/545,678, Jun. 20, 2012, Notice of Allowance.
U.S. Appl. No. 12/606,880, Aug. 31, 2012, Notice of Allowance.
A. Jia, et al. "Design of a new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090.
Al-Salim, Najeh, Synthesis of CdSeS Nanocrystals in Coordinating and Noncoordinating Solvents: Solvent's Role in Evolution of the Optical and Structural Properties, Mar. 26, 2007.
Alda, Javier et al., "Optical antennas for nano-photonic applications," vol. 16, No. 5, Trends on Nanothecnology. TNT2004. Phantoms Foundations. Segovia (Spain). Sep. 13-17, 2004, http://www.iop.org/EJ/abstract/0957-4484/16/5/017.
Arup Neogi, et al. "Enhancement of spontaneous recombination rate in a quantum well by resonant surface plasmon coupling" Physical Review B, vol. 66 (2002) pp. 153305-1-153305-4.
Australian Patent Office; International Search Report and Written Opinion in corresponding PCT application (PCT/KR2010/007292); mailed Jan. 26, 2011.
B. Ullrich, Semiconductor Science and Technology "Green emission and bandgap narrowing due to two-photon excitation in thin film CdS formed by spray pyrolysis", published Jun. 22, 2011.
Chul Huh, et al., "Improvement in light-output efficiency of InGaN/GaN multiple-quantum well light-emitting diodes by current blocking layer", Appl. Phys., vol. 92, No. 5, Sep. 1, 2002, 2248-2250, American Institute of Physics.
D. Ahn, et al. "Electric field dependence of instrasubband polar-optical-phonon scattering in a quantum well" Physical Review B, vol. 37, No. 5, Feb. 15, 1988-I, pp. 2529-2535.
D. Ahn, et al. "A field-effect quantum-well laser with lateral current injection". J.Appl. Phys. 64(1). Jul. 1, 2998, 440-442, American Institue of Physics.
D. Ahn, et al. "Optical Gain and Luminescence of a ZnO-MgZnO Quantum Well" IEEE Photonics Technology Letters vol. 18, No. 2, Jan. 15, 2006 pp. 349-351.
D-M. Yeh, et al "Surface plasmon coupling effect in an InGaN/GaN single-quantum-well light-emitting diode" Appl. Phys. Lett. 91, 171103 (2007).
Doyeol Ahn, et al. "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.
Doyeol Ahn, "Theory of Non-Markovian Gain in Strained-Layer Quantum-Well Lasers with Many-Body Effects" IEEE Journal of Quantum Electronics, vol. 34, No. 2, Feb. 1998, pp. 344-352.
Doyeol Ahn, "Time-convolutionless reduced-density-operator theory of an arbitrary driven system coupled to a stochastic reservoir: Quantum kinetic equations for semiconductors" Physical Review B, vol. 50, No. 12, Sep. 15, 1994-II, pp. 8310-8318.
Doyeol Ahn, "Time-convolutionless reduced-density-operator theory of an arbitrary driven system coupled to a stochastic reservoir.

(56) References Cited

OTHER PUBLICATIONS

II. Optical gain and line-shape function of a driven semiconductor" Physical Review B, vol. 51, No. 4, Jan. 15, 1995-II, pp. 2159-2166.

E. H. Sargent, et al "Lateral Injection Lasers" International Journal of High Speed Electronics and Systems, Dec. 1998, vol. 9, No. 4, pp. 941-978.

Hetterich J., et al, Optimized Design of Plasmonic MSM Photodetector, IEEE Journal of Quantum Electronics Oct. 2007, vol. 43, No. 10, pp. 855 to 859.

Hoang, T. et al., "A high efficiency lateral light emitting device on SOI," Electron Devices for Microwave and Optoelectronic Applications, EDMO 2004, 12th International Symposium, Nov. 8-9, 2004, pp. 87-91.

Hyunsoo Kim, et al., "Lateral current transport path, a model for GaN-based light-emitting diodes; application to practical device designs", Appl. Phys. Lett., vol. 81, No. 7, Aug. 12, 2002, 1326-1328, American Institute of Physics.

I.V. Bradley et al. "Space-charge effects in type-II strained layer superlattices" Journal of Crystal Growth 184/185 (1998) pp. 728-731.

J. Ueno, et al. "MBE growth of AnSe/MgCdS and ZnCdS/MgCdS superlattices for UV-A sensors" Phys. Stat. Sol. (c) 3, No. 4, pp. 1225-1228 (2006).

Jie Liu, et al. "AlGaN/GaN/InGaN/GaN DH-HEMTs With an InGaN Notch for Enhanced Carrier Confinement" IEEE Electron Device Letters, vol. 27, No. 1, Jan. 2006, pp. 10-12.

K. Leosson, et al. "Long-range surface plasmon polariton nanowire waveguides for device applications" Optics Express, vol. 14, No. 1, Jan. 9, 2006 pp. 314-319.

Koichi Okamoto, et al. "Surface-plasmon-enhanced light emitters based on InGaN quantum wells" Nature Materials, vol. 3, Sep. 2004, pp. 601-605.

LEDs Magazine, "Goldeneye sets brightness benchmark for green LEDs", http://www.ledsmagazine.com/news/5/5/18, May 15, 2008, 2 pages.

Liu Liu, et al. "Novel surface plasmon waveguide for high integration" Optics Express, vol. 13, No. 17, Aug. 22, 2005 pp. 6645-6650.

P.I. Kuznetsov, et al. "Hexagonal ZnCdS epilayers and CdSSe/ZnCdS SQ structures on CdS(0001) and ZnCdS (0001) substrates grown by MOVPE" Physica E, vol. 17 (2003) pp. 516-517.

P. Waltereit, et al., Nitride semiconductors free of electrostatic fields for efficient white light-emitting diodes, Nature, vol. 406, Aug. 24, 2000, 865-868, Macmillan Magazines Ltd.

R. Paschotta "Encyclopedia of Laser Physics and Technology, Volume 1", Wiley-VCH, 2008, ISBN 3527408282, 9783527408283 p. 595.

S. Bai, et al. "Determination of the electric field in 4H/3C/4H-SiC quantum wells due to spontaneous polarization in the 4H SiC matrix" Appl. Phys. Lett. 83, 3171 (2003).

Seong-Ran Jeon, et al., "GaN tunnel junctions as a current aperture in a blue surface-emitting light-emitting diode", Appl. Phys. Lett., vol. 80, No. 11, Mar. 18, 2002, 1933-1935, American Institute of Physics.

Seong-Ran Jeon, et al., "Lateral current spreading in GaN-based light-emitting diodes utilizing tunnel contact junctions", Appl. Phys. Lett., vol. 78, No. 21, May 21, 2001, 3265-3267, American Institute of Physics.

Seoung-Hwan Park, "Crystal Orientation Effects in Electronic Properties of Wurtzite GaN/AlGaN Quantum Wells with Spontaneous and Piezoelectric Polaritzation", Jpn. J. Appl. Phys. vol. 39, Part 1, No. 6A, Jun. 2000, 3478-3482, The Japan Society of Applied Physics.

Seoung-Hwan Park, et al., "Crystal-orientation effects on the piezoelectric field and electronic properties of strained wurtzite semiconductors", vol. 59, No. 7, Feb. 15, 1999, 4725-4737, The American Physical Society.

Seoung-Hwan Park, et al. "Many-body optical gain and intraband relaxation time of wurtzite InGaN/GaN quantum-well lasers and comparison with experiment" Applied Physics Letters 87, 044103 (2005).

Seoung-Hwan Park, et al. "Many-body optical gain of wurtzite GaN-based quantum-well lasers and comparison with experiment" Appl. Phys. Lett. 72 (3), Jan. 19, 1998, pp. 287-289.

Seoung-Hwan Park, et al. "Optical gain in InGaN/InGaAlN quantum well stuctures with zero internal field" Applied Physics Letters, vol. 92, 171115 (2008) pp. 171115-1-171115-3.

Seoung-Hwan Park, et al. "Piezoelectric effects on electrical and optical properties of wurtzite GaN/AlGaN quantum well lasers" Applied Physics Letters vol. 72, No. 24, Jun. 15, 1998, pp. 3103-3105.

Seoung-Hwan Park, et al. "Spontaneous and piezoelectric polarization effects in wurtzite ZnO/MgZnO quantum well lasers" Applied Physics Letters, vol. 87, 253509 (2005) pp. 253509-1-253509-3.

Sergey I. Bozhevolnyi, et al. "Channel Plasmon-Polariton Guiding by Subwavelength Metal Grooves" Physical Review Letters, vol. 95, 046802, Jul. 22, 2005, pp. 046802-1-046802-4.

Siliconfareast.com; "Lattice Constants"; http://www.siliconfareast.com/lattice_constants.htm; 2 pages; retrieved Oct. 7, 2011.

Smith S.J. et al., "Lateral light emitting n-i-p diodes in InSb/Alxln1-xSb quantum wells," Applied Physics Letters, vol. 89, p. 111118 (2006), 3 pages.

Sumith, B. et al., Quantum Well Infrared Photodetectors for Long Wavelength Infrared Applications Proceedings of SPIE, Oct. 1998, vol. 3436, Infrared Technology and Applications XXIV, pp. 280 to 284.

Taguchi, T., et al., Ultraviolet Laser and Photodetector of CdZnS/ZnS Multiple Quantum Wells, Physica B. 1993, vol. 191, pp. 136 to 139.

Tsung-Hsing Yu, et al. "Theoretical study of the two-dimensional electron mobility in strained III-nitride heterostructures" Journal of Applied Physics, vol. 89, No. 7, Apr. 1, 2001, pp. 3827-3834.

Wikipedia; "Wurtzite crystal structure", http://en.wikipedia.org/wiki/Wurtzite_crystal_structure; 1 page; retrieved Oct. 7, 2011.

Yifei Zhang, et al. "Charge control and mobility studies for an AiGan/GaN high electron mobility transistor" Journal of Applied Physics, vol. 85, No. 1, Jan. 1, 1999, pp. 587-594.

Yu, E.T., et al., Plasmonic Nanoparticle Scattering for Enhanced Performance of Photocoltaic and Photodetector Devices, Proceedings of SPIE, Aug. 28, 2008, vol. 7033, Plasmonics: Nanoimaging Nanofabrication and their Application IV, pp. 70331V-1 to 70331V-9.

"II-VI solar cells moving to the production phase," Photovoltaics Bulletin., (2003), vol. 2003, No. 11, Oct. 2003, pp. 10-12.

Andreani, Lucio Claudio, et al, Exchange interaction and polariton effects in quantum-well excitons, Physical Review B, vol. 41, No. 11, pp. 7536-7544 (1990).

Angelakis, D. G., et al., "Photon-blockade-induced Mott transitions and XY spin models in coupled cavity arrays," Phys. Rev. A76, 031805 (2007).

Chu, T.L., and Chu, S.S., "Thin film II-VI photovoltaics," vol. 38, Issue 3, Mar. 1995, pp. 533-549.

Compaan, A. D., et al., "Sputtered II-VI Alloys and Structures for Tandem PV," Subcontract Report NREL/SR-520-43954, Sep. 2008, pp. 64.

Gogolin, O., et al., Temperature dependence of exciton peak energies in Cui quantum dots, Solid State Communications, vol. 122, pp. 511-513 (2002).

Goosen, K.W., "Excitonic electroabsorption in extremely shallow quantum wells," Appl. Phys. Lett., vol. 57, Issue 24, pp. 2582-2584, (1990).

Greentree, A.D., et al., "Quantum phase transitions of light," Nature Physics 2, pp. 856-861 (2006).

Hartmann, M.J., and Plenio, M.B., "Strong Photon Nonlinearities and Photonic Mott Insulators," Physical Review Letters, vol. 99, Issue 10, Sep. 7, 2007, pp. 103601-1 to 103601-4.

Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).

Klimov, V.I., et al., "Optical Gain and Stimulated Emission in Nanocrystal Quantum Dots," Science, Oct. 13, 2000, vol. 290, No. 5490, pp. 314-317.

Little, R. B., et al., "Formation of quantum-dot quantum-well heteronanostructures with large lattice mismatch: ZnS/CdS/ZnS" Journal of Chemical Physics, vol. 114, No. 4, 2001, pp. 1813-1822.

(56) References Cited

OTHER PUBLICATIONS

Masumoto, Y., et al., "Observation of persistent spectral hole burning in CuBr quantum dots," Physical Review B, vol. 52, No. 7, pp. 4688-4691 (1995).
Obloh, H., "Group III-nitride based blue emitters," Advances in Solid State Physics, vol. 38, 15-28 (1999).
Park, S.-H., et al., "Internal field engineering in CdZnO/MgZnO quantum well structures," Applied Physics Letters, vol. 94, Issue:8, pp: 083507, 1-3 (2009).
Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, Mar. 27, 2007, pp. 4.
Tassone, F., et al, "Quantum-well reflectivity and exciton-polariton dispersion," Physical Review B, vol. 45, No. 11, pp. 6023-6030 (1992).
Valenta, J., et al., "Hole-filling of persistent spectral holes in the excitonic absorption band of CuBr quantum dots," Applied Physics Letters, vol. 70, No. 6, pp. 680-682 (1997).
Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).
Hernández, F. E. et al., "High Performance Optical Limiter," accessed at http://web.archive.org/web/20050429144449/http://www.ieee.org/organizations/pubs/ newsletters/leos/dec00/high.htm, accessed on May 7, 2012, pp. 5.
Shakya, J., et al., "Switching characteristics of III-Nitride blue/green micro-LEDs," The Smithsonian/NASA Astrophysics Data System, American Physical Society, Annual March Meeting, Mar. 12-16, 2001.
S.X. Jin, et al., "Size dependence of III-nitride microdisk light-emitting diode characteristics," Applied Physics Letters, May 28, 2001, vol. 78, No. 22, pp. 3532-3534.
International Search Report and Written Opinion, mailed Aug. 10, 2010, as issued in connection with Patent Application No. PCT/KR2011/003322, filed on May 26, 2010.
International Search Report and Written Opinion, mailed Sep. 10, 2010, as issued in connection with Patent Application No. PCT/KR2010/004350, filed on Jul. 5, 2010.
International Search Report and Written Opinion for International Application No. PCT/KR2010/002649 mailed on Jul. 26, 2010.
International Search Report and Written Opinion for International Application No. PCT/KR2010/005600 mailed on Oct. 22, 2010.
International Search Report and Written Opinion for International Application No. PCT/KR2010/008118 mailed on Feb. 11, 2011.
U.S. Appl. No. 12/472,168, Jun. 18, 2010, Office Action.
U.S. Appl. No. 12/472,168, Jul. 21, 2010, Office Action.
U.S. Appl. No. 12/472,168, Jan. 5, 2011, Office Action.
U.S. Appl. No. 12/472,168, Feb. 22, 2011, Notice of Allowance.
U.S. Appl. No. 12/472,168, Aug. 18, 2011, Notice of Allowance.
U.S. Appl. No. 12/472,168, Sep. 1, 2011, Notice of Allowance.
U.S. Appl. No. 12/472,168, Mar. 29, 2012, Notice of Allowance.
U.S. Appl. No. 12/472,168, May 29, 2012, Notice of Allowance.
U.S. Appl. No. 12/498,265, May 17, 2011, Office Action.
U.S. Appl. No. 12/498,265, Aug. 26, 2011, Office Action.
U.S. Appl. No. 12/498,265, Feb. 28, 2012, Office Action.
U.S. Appl. No. 12/498,228, Sep. 1, 2010, Office Action.
U.S. Appl. No. 12/498,228, Dec. 23, 2010, Office Action.
U.S. Appl. No. 12/498,228, Jul. 12, 2011, Office Action.
U.S. Appl. No. 12/498,228, Dec. 15, 2011, Notice of Allowance.
U.S. Appl. No. 12/498,204, Apr. 26, 2011, Office Action.
U.S. Appl. No. 12/498,204, Jul. 21, 2011, Notice of Allowance.
U.S. Appl. No. 12/498,204, Jul. 28, 2011, Notice of Allowance.
U.S. Appl. No. 12/498,204, Oct. 25, 2011, Notice of Allowance.
U.S. Appl. No. 12/498,204, Feb. 1, 2012, Office Action.
U.S. Appl. No. 12/498,204, Mar. 26, 2012, Notice of Allowance.
U.S. Appl. No. 12/498,204, May 29, 2012, Notice of Allowance.
U.S. Appl. No. 12/498,257, Nov. 23, 2011, Office Action.
U.S. Appl. No. 12/606,880, Apr. 29, 2011, Office Action.
U.S. Appl. No. 12/606,880, Aug. 15, 2011, Notice of Allowance.
U.S. Appl. No. 12/606,880, Nov. 17, 2011, Notice of Allowance.
U.S. Appl. No. 12/606,880, Feb. 16, 2012, Notice of Allowance.
U.S. Appl. No. 12/606,880, May 23, 2012, Notice of Allowance.
Wikipedia; "Zinc Selenide", http://en.wikipedia.org/wiki/Zinc_selenide; 3 pages; available as of Mar. 15, 2013.
U.S. Appl. No. 12/472,168, Oct. 1, 2012, Notice of Allowance.
U.S. Appl. No. 12/472,168, Jan. 23, 2013, Issue Notification.
U.S. Appl. No. 12/493,800, Oct. 4, 2012, Notice of Allowance.
U.S. Appl. No. 12/493,800, Jan. 16, 2013, Issue Notification.
U.S. Appl. No. 12/498,265, Mar. 15, 2013, Office Action.
U.S. Appl. No. 12/498,257, Nov. 15, 2012, Notice of Allowance.
U.S. Appl. No. 12/498,257, Feb. 20, 2013, Issue Notification.
U.S. Appl. No. 12/545,678, Oct. 2, 2012, Notice of Allowance.
U.S. Appl. No. 12/545,678, Jan. 16, 2013, Issue Notification.
U.S. Appl. No. 12/606,880, Oct. 3, 2012, Notice of Allowance.
U.S. Appl. No. 12/606,880, Jan. 16, 2013, Issue Notification.
U.S. Appl. No. 13/279,945, Jan. 25, 2013, Notice of Allowance.
Fujikata, J., et al., "Waveguide-Integrated Si Nano-Photodiode with Surface-Plasmon Antenna and its Application to On-chip Optical Clock Distribution," Applied Physics Express, vol. 1 , pp. 176-178 (2008).
Nishida, N., et al. "Heteroepitaxy of CuCl on GaAs and Si substrates," Surface Science, vol. 324, Issue 2-3, pp. 149-158 (1995).
Takata, M., et al., "MBE growth condition of CuCl thin Minns and their optical properties," CAMP 14th, pp. 27-30 (2003).
Yanase, A., and Segawa, Y., "Stranski-Krastanov growth of CuCl on MgO(001)," Surface Science, vol. 367, Issue 1, pp. L1-L7 (1996).
Wikipedia, "Zinc Selenide," accessed at http://web.archive.org/web/20090504023429/http://en.wikipedia.org/wiki/Zinc_selenide, last modified on Apr. 12, 2009, 2 pages.
Schubert, E. Fred, Light-Emitting Diodes, 1st Edition, Chapter 8, pp. 155-177 (2003, Cambridge University Press).
S.M.Sze, Bell Laboratories, Incorporated, Physics of Semiconductor Devices, 2nd Edition, Chapter 13, pp. 743-789 (1981, John Wiley & Sons, Inc).
S.M.Sze, Modern Semiconductor Device Physics, Chapter 7, pp. 409-472 (1998, John Wiley & Sons, Inc).
Machine translation of JP-07-202340, Aug. 4, 1995.

\* cited by examiner

US 8,802,481 B2

PHOTODETECTOR CAPABLE OF DETECTING THE VISIBLE LIGHT SPECTRUM

CROSS-REFERENCE TO RELATED APPLICATIONS

This application is a continuation of U.S. application Ser. No. 12/498,204 filed Jul. 6, 2009, titled "PHOTODETECTOR CAPABLE OF DETECTING THE VISIBLE LIGHT SPECTRUM", which is incorporated herein by reference in its entirety.

BACKGROUND

The portion of the electromagnetic spectrum visible to humans is called the visible light spectrum. Detection of the visible light spectrum is useful in various fields of technology. For example, photodetectors for detecting the visible light spectrum can be used in medical equipment, display devices, automotive electronics, household appliances, etc. As nano-technology involving the design of nano-scale electronics including optical devices and photodetectors (i.e., structures having a size of about 100 nm or smaller) continues to develop, it is envisioned that advances in nano-technology may be applied to the design of such nano-scale electronics (i.e., optical devices and photodetectors) for improved efficiency and detection.

SUMMARY

Apparatuses capable of and techniques for detecting the visible light spectrum (e.g., red, blue, green spectrum light) are provided. In an illustrative embodiment, by way of non-limiting example, a photodetector capable of detecting the visible light spectrum includes a source disposed on a proximal end of an insulation layer, a drain disposed on a distal end of the insulation layer, at least one nano-assembly coupling the source and the drain between the proximal and distal ends, at least two surface plasmon waveguides positioned between the source and the drain and juxtaposed to the at least one nano-assembly in a longitudinal direction of the at least one nano-assembly, and a transparent gate positioned in proximity to the at least one nano-assembly and the at least two surface plasmon waveguides and further being arranged so as to extend substantially parallel to at least one of the source and drain, and wherein one of the at least two surface plasmon waveguides is positioned along a first side of the at least one nano-assembly, and another of the at least two surface plasmon waveguides is positioned along a second side of the at least one nano-assembly that is opposite the first side.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
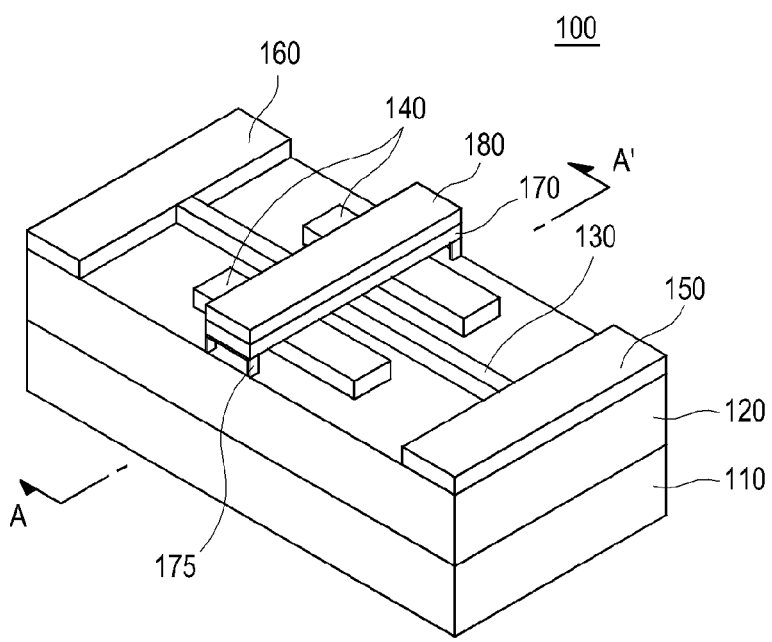
FIG. 1 shows a perspective view of an illustrative embodiment of a photodetector.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 shows a perspective view of an illustrative embodiment of a photodetector 100 that may be used to detect the visible light spectrum. As depicted in FIG. 1, photodetector 100 may be formed on a stacked structure of a substrate 110 and an insulation layer 120. Further, a nano-assembly 130, surface plasmon waveguides (hereinafter referred to as "SP waveguides") 140, a source 150 and a drain 160 may be arranged on insulation layer 120. Source 150 and drain 160 may be disposed on proximal and distal ends of the stacked structure, respectively. For example, source 150 and drain 160 may be disposed on proximal and distal ends of insulation layer 120, respectively. When incident light (i.e., a photon with a specific energy) is received by photodetector 100, an electron in nano-assembly 130 may absorb the energy of the photon, by which nano-assembly 130 operates as a channel to interconnect source 150 and drain 160. In this case, predetermined current may flow in an external circuit (not shown) coupled to photodetector 100. SP waveguides 140 function to allow a photon (i.e., incident light) to be effectively confined around nano-assembly 130.

SP waveguides 140 may be positioned between source 150 and drain 160 and juxtaposed to nano-assembly 130 in a longitudinal direction of nano-assembly 130. Further, one SP waveguide 140 may be positioned along a first side of nano-assembly 130 and another SP waveguide 140 may be positioned along a second side of nano-assembly 130 that is opposite the first side, defining at least some space between SP waveguides 140 and nano-assembly 130, which may be several to thousands of nanometers. The alternating arrangement of nano-assembly 130 and SP waveguides 140 provides an interface to receive photons from incident light and allows the photons to be effectively confined around nano-assembly 130 between SP waveguides 140, as will be further described below in conjunction with FIG. 6. In one embodiment, the space between SP waveguides 140 and nano-assembly 130 may be filled with a dielectric material such as porcelain (ceramic), mica, glass, plastics, the oxides of various metals, or air, but may include any type of dielectric material.

A transparent gate 180 may be formed above or substantially on top of nano-assembly 130 and SP waveguides 140. An insulation layer 170 may be positioned between transparent gate 180 and nano-assembly 130 (or SP waveguide 140). Although it is shown in FIG. 1 that insulation layer 170 and transparent gate 180 are arranged above nano-assembly 130 and SP waveguides 140 by using supporting members 175, any variety of other suitable structures may be adopted to place insulation layer 170 and transparent gate 180 on nano-assembly 130 and SP waveguides 140. Transparent gate 180 may be positioned substantially perpendicular to nano-assembly 130 and SP waveguide 140 and substantially parallel to the elongated direction of source 150 or drain 160. Transparent gate 180 may be arranged in proximity to at least one nano-assembly 130 and at least two SP waveguides 140 so as to extend substantially parallel to at least one of source 150 and drain 160. Transparent gate 180 functions to reduce the internal field of nano-assembly 130 caused by spontaneous polarization (as will be further described in detail below) of nano-assembly 130.

Figure 2:
FIG. 2 shows the visible light spectrum that may be detected in an illustrative embodiment.

FIG. 2 illustrates the range of wavelengths in the visible light spectrum that may be detected by photodetector 100. As shown in FIG. 2, the visible light spectrum corresponds to a wavelength range of about 380 to about 780 nm (e.g., corresponding to a color spectrum ranging from violet through red). For example, visible blue light, visible green light, and visible red light have wavelengths of about 450 nm, about 520 nm, and about 650 nm, respectively. Photodetector 100 may detect the visible light spectrum by measuring interband transition of electrons in nano-assembly 130.

Figure 3:
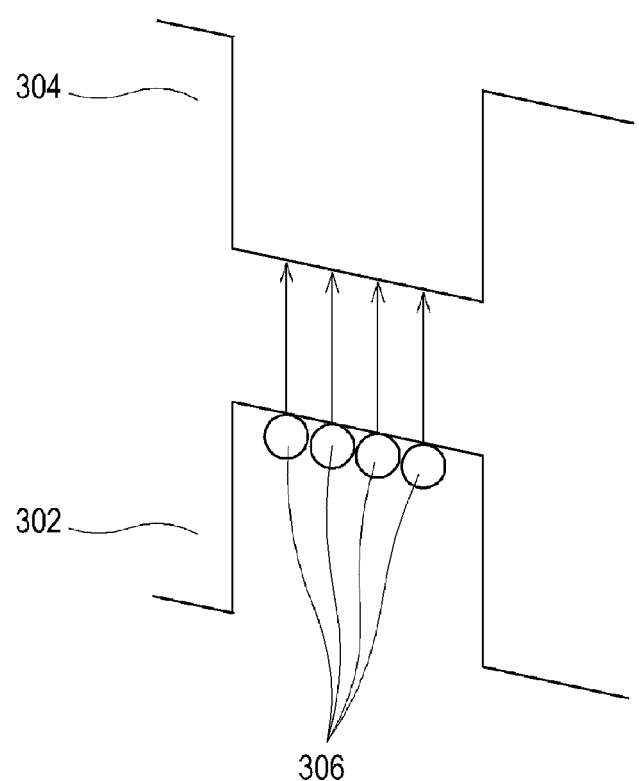
FIG. 3 shows a conceptual view of an illustrative embodiment of an interband transition in a nano-assembly.

FIG. 3 is a conceptual view of an illustrative embodiment of an interband (i.e., band-to-band) transition of electrons between a valence band 302 and a conduction band 304 in nano-assembly 130. When a photon having an energy corresponding to the band gap energy between valence band 302 and conduction band 304 impinges on nano-assembly 130, electrons 306 in valence band 302 may transition to conduction band 304. The transition of electrons 306 from valence band 302 to conduction band 304 (band-to-band transition) causes an electric current to flow through photodetector 100.

Figure 4:
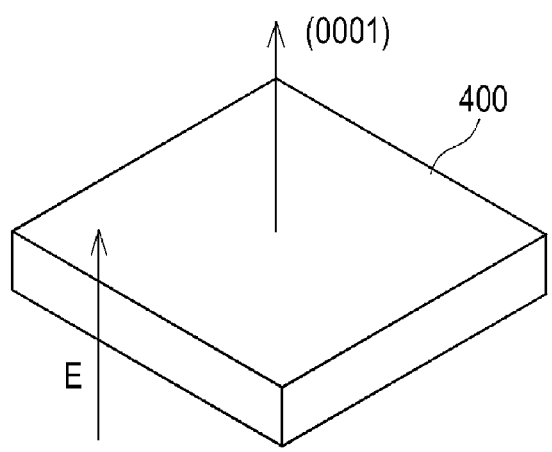
FIG. 4 shows an illustrative embodiment of the structure of a ZnO nanobelt.

FIG. 4 illustrates the basic structure of a ZnO nanobelt 400, which may have a width of about 100 nm and a thickness of about 10 nm. As shown in FIG. 4, the side faces of ZnO nanobelt 400 may include (0001) polar surfaces. In this case, owing to the positive and negative ionic charges on (0001) polar surfaces respectively, spontaneous polarization is induced across ZnO nanobelt 400. As a result, there is an internal field (E) formed along (0001) direction, which minimizes the total energy contribution by spontaneous polarization and degrades the optical transition probability. As shown in FIG. 1, transparent gate 180 may be provided to compensate the internal field (E) in nano-assembly 130 by being arranged above or substantially on top of nano-assembly 130.

In one embodiment, insulation layer 170 may be positioned between nano-assembly 130 (and/or SP waveguides 140) and transparent gate 180.

Figure 5:
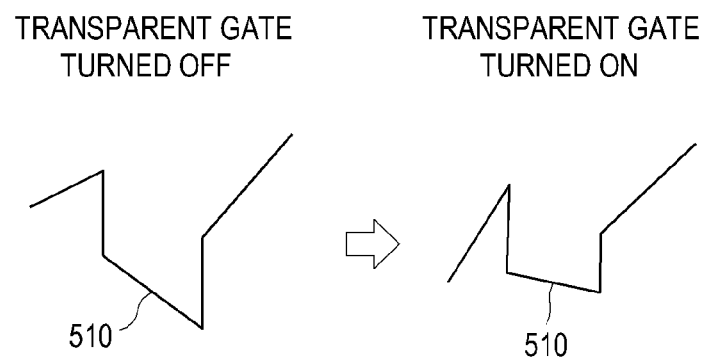
FIG. 5 shows an illustrative embodiment of energy band diagrams of a nano-assembly of a photodetector.

FIG. 5 shows an illustrative embodiment of energy band diagrams of nano-assembly 130 of photodetector 100. The energy band diagram on the left portion in FIG. 5 shows a conduction band in nano-assembly 130 that is obtained if transparent gate 180 does not exist (i.e., is not present) in photodetector 100. Further, the energy band diagram on the right portion of FIG. 5 shows a conduction band in nano-assembly 130 that is obtained if transparent gate 180 does exist (i.e., is present) in photodetector 100. Comparing the two diagrams to each other, an inclination 510 of the energy band diagram (i.e., a lower bound of the conduction band) becomes smaller when transparent gate 180 is provided in photodetector 100 because the internal field in nano-assembly 130 resulting from spontaneous polarization is weakened by applying reverse voltage to transparent gate 180 above or substantially on top of nano-assembly 130. A reverse voltage opposing the direction of the internal field (E) in nano-assembly 130 may be applied from an external circuit (not shown) to transparent gate 180, thereby cancelling the internal field of nano-assembly 130.

Figure 6:
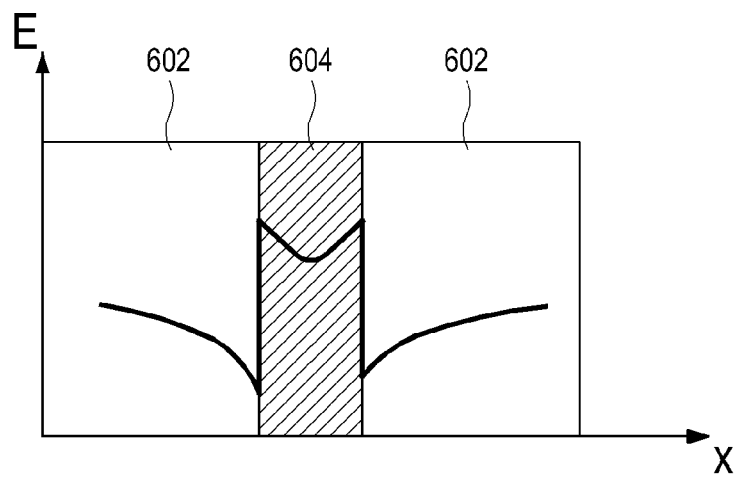
FIG. 6 is a graph showing electric field intensity of photons confined in an interface of an illustrative embodiment of the photodetector.

FIG. 6 illustrates a graph showing electric field intensity of photons confined in an interface of photodetector 100, which includes SP waveguides 140 and nano-assembly 130 arranged between SP waveguides 140. In FIG. 6, while regions 602 corresponding to SP waveguides 140 include metal material, a region 604 corresponding to nano-assembly 130 includes dielectric material, as also shown in FIG. 1. Further, while the x-axis indicates the horizontal position of nano-assembly 130 and SP waveguides 140, the y-axis indicates electric field intensity. The graph shown in FIG. 6 illustrates that a substantial portion of the optical field produced by incident light (i.e., photons) is confined within region 604. The electric field confined between regions 602 and region 604 may be explained by Equation 1 shown below.

$$\frac{D_{x\_dielectric}}{D_{x\_metal}} = \frac{\varepsilon_{dielectric} E_{x\_dielectric}}{\varepsilon_{metal} E_{x\_metal}} = 1 \quad \text{[Equation 1]}$$

$$\therefore \frac{E_{x\_dielectric}}{E_{x\_metal}} = \frac{\varepsilon_{metal}}{\varepsilon_{dielectric}}$$

Where $D_{x\_metal}$ and $D_{x\_dielectric}$ respectively refer to electric displacement fields in region 602 (corresponding to metal material included in SP waveguides 140) and region 604 (corresponding to dielectric material included in nano-assembly 130), $E_{x\_metal}$ and $E_{x\_dielectric}$ respectively refer to electric fields in region 602 and region 604, and $\varepsilon_{metal}$ and $\varepsilon_{dielectric}$ respectively refer to the permittivity of region 602 and region 604. In Equation 1, since the value of $\varepsilon_{metal}$ is much greater than the value of $\varepsilon_{dielectric}$, $E_{x\_dielectric}$ becomes greater than $E_{x\_metal}$, which means that a substantial portion of the optical field is confined within region 604.

Referring to FIG. 6 and Equation 1, the electric field of the incident photons confined between SP waveguides 140 (i.e., nano-assembly 130) is substantially proportional to the ratio between the permittivity of SP waveguides 140 and the permittivity of nano-assembly 130 (and/or dielectric material filled between SP waveguides 140). Thus, the desired confinement of the electrical field may be obtained by selecting material(s) of appropriate permittivity for SP waveguides 140 and/or nano-assembly 130, even in the case where the width of nano-assembly 130 and/or the height of SP waveguides 140 are smaller than the wavelength of incident photons. In such an embodiment, SP waveguides 140 may be fabricated from one or more various types of metals. As shown in Equation 2 below, the permittivity $\varepsilon_{metal}$ of a metal is a function of frequency and, thus, the type of metal used may depend on the frequency of the photons that are to be detected by photodetector 100. The types of metal may be chosen based on the spectrum range to be detected by photodetector 100. In one embodiment, a compound such as Ag, Al, Au, Ni, Ti, or any other appropriate metal may be selected for visible light spectrum detection.

$$\varepsilon_{metal}(\omega) = 1 - \frac{\omega_p^2}{\omega^2} \quad \text{[Equation 2]}$$

where symbol $\omega_p$ represents plasma frequency of collective oscillations of the free conduction electrons.

Figure 7:
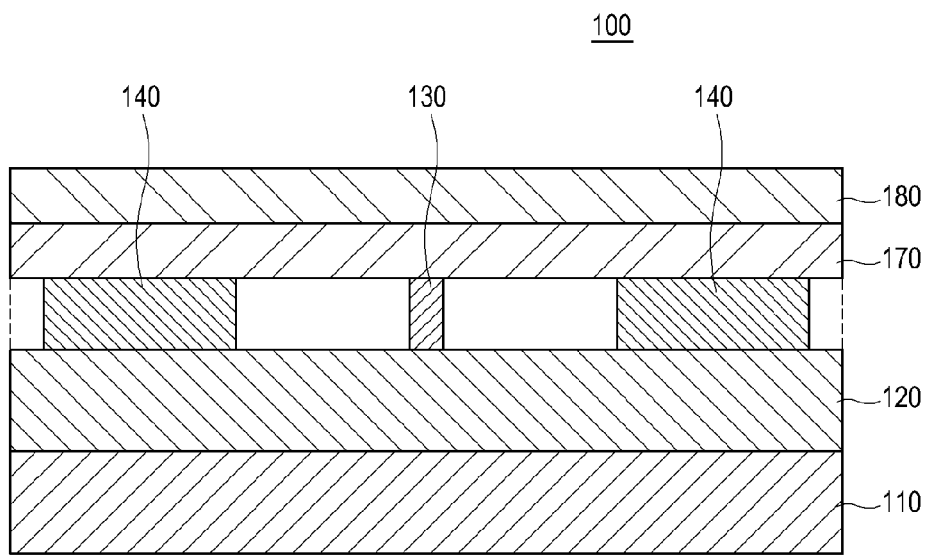
FIG. 7 shows a cross-sectional view of the illustrative embodiment of the photodetector of FIG. 1.

FIG. 7 shows a cross-sectional view of photodetector 100 taken along line A-A' in FIG. 1. In FIG. 7, the cross-sectional dimensions of nano-assembly 130 are on the nanometer scale. In some embodiments, nano-assembly 130 may have a width from about 10 nm to about 500 nm, such as about 10 nm, about 20 nm, about 50 nm, about 100 nm, about 200 nm, or about 500 nm, and a length from about 0.5 μm to about 5 μm, such as about 0.5 μm, about 1 μm, about 2 μm, about 3 μm, about 4 μm, or about 5 μm. In other embodiments, nano-assembly 130 may have a width from about 30 nm to about 300 nm, a width-to-thickness ratio from about 5 to about 10, and a length of up to a few millimeters. The width and length of nano-assembly 130 may be varied substantially in various embodiments. Nano-assembly 130 may be a nano-wire, a nano-belt, a nano-rod, etc. In some embodiments, the thickness of SP waveguide 140 ranges from about 2 μm to about 3 μm to obtain a fine confinement of the photons. Although SP waveguide 140 is shown as having a rectangular shape in FIGS. 1 and 7, the shape and dimensions of SP waveguide 140 may be varied according to each application. For example, each of SP waveguides 140 may have a slab, a rib, or a ridge shape for use in photodetector 100.

In one embodiment, source 150 and drain 160 may include any metal, silicide, or semiconductors such as silicon, germanium, II-VI semiconductor compounds, or III-V semiconductor compounds. Examples of applicable II-VI semiconductor compounds may include CdS, CdSe, CdTe, ZnS, ZnSe, ZnTe, HgS, HgSe, HgTe, CdZnSe, CdSSe, or ZnSSe, and examples of III-V semiconductor compounds may include GaAs, InP, GaP, AlGaAs, or GaN. Substrate 110 may include glass, silicon, or quartz. Insulation layers 120 and 170 may include silicon dioxide (SiO2), a fluorosilicate glass (FSG), a tetraethyl orthosilicate (TEOS) oxide, a silanol (SiOH), a flowable oxide (FOx), a bottom anti-reflective coating (BARC), an anti-reflective coating (ARC), a photoresist (PR), a near-frictionless carbon (NFC), a silicon carbide (SiC), a silicon oxycarbide (SiOC), and/or a carbon-doped silicon oxide (Si-COH). SP waveguide 140 and transparent gate 180 may include any type of metal material including Ag, Al, Au, Ni or Ti. In one embodiment, nano-assembly 130 may be made from III-V and II-VI semiconductor materials. Table 1 below shows examples of III-V and II-VI semiconductor materials with corresponding band gap energy (eV), the lattice constant (a-axis) in angstroms (Å) and crystal structure.

TABLE 1

| Material | Band gap energy (eV) | Lattice constant (Å) | Crystal structure |
|---|---|---|---|
| CdSe | about 1.732 | about 4.2999 | wurtzite |
| CdS | about 2.428 | about 4.135 | wurtzite |
| ZnS | about 3.67 | about 3.82 | wurtzite |
| MgSe | about 4.05 | about 4.15 | hexagonal |
| MgS | about 4.87 | about 5.203 | rocksalt |
| ZnO | about 3.44 | about 3.25 | wurtzite 1 |
| MgO | about 7.672 | about 4.22 | rocksalt |
| CdO | about 2.28 | about 4.69 | rocksalt |
| BeO | about 10.585 | about 2.698 | wurtzite |

The nano-materials of nano-assembly 130 may be selected depending on the range of visible light spectrum to be detected. In one embodiment, nano-assembly 130 may include CdZnS, which is an alloy of CdS and ZnS. CdS and ZnS are direct band gap semiconductor materials and have a hexagonal crystal structure. The band gap energy of $Cd_xZn_{1-x}S$ may be determined by Equation 3 below.

$$E_g = 3.723 - 1.241x \quad \text{[Equation 3]}$$

When x=0.7, the band gap energy $E_g$ of CdZnS is 2.853 eV, which corresponds to an energy of a photon having a wavelength of about 435 nm (blue spectrum light). In one embodiment, where nano-assembly 130 includes $Cd_xZn_{1-x}S$ (0≤x≤0.5), photodetector 100 may be suitable for detecting the blue spectrum.

In another embodiment, nano-assembly 130 may include CdSSe. CdSSe is an alloy of CdS and CdSe which are direct band gap semiconductor materials and have a hexagonal crystal structure. The band gap energy of $CdSe_xS_{1-x}$ may be determined by Equation 4 below.

$$E_g = 2.482 - 0.75x \quad \text{[Equation 4]}$$

When x=0.15, the band gap energy $E_g$ of CdSSe is 2.37 eV, which corresponds to an energy of a photon having a wavelength of about 520 nm (green spectrum light), and when x=0.7, the band gap energy $E_g$ of CdSSe is 1.957 eV, which corresponds to an energy of a photon having a wavelength of about 633 nm (red spectrum light). That is, nano-assembly 130 including CdSSe may be suitable for detecting both green and red spectrum light. In one embodiment where nano-assembly 130 includes $CdSe_xS_{1-x}$ (0≤x≤0.4), photodetector 100 may be suitable for detecting green spectrum light. In one embodiment where nano-assembly 130 includes $CdSe_xS_{1-x}$ (0.6≤x≤1.0), photodetector 100 may be suitable for detecting red spectrum light. Other appropriate nano-materials(s) may be applied to photodetector 100 for detecting a desired spectrum range.

Figure 8:
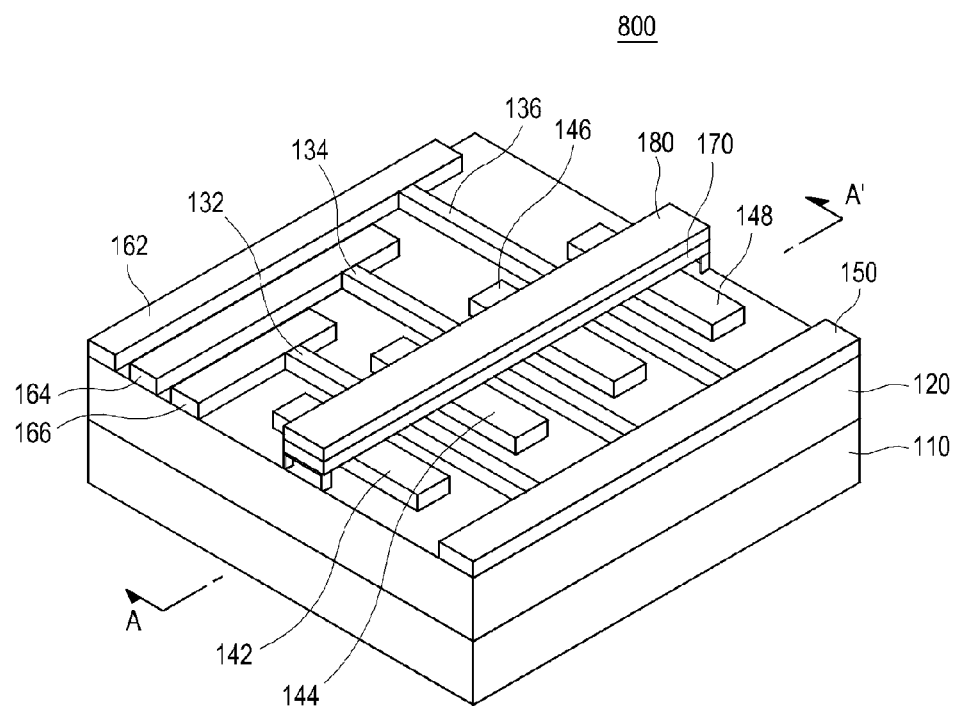
FIG. 8 shows a perspective view of an illustrative embodiment of a photodetector for detecting three different spectrum ranges.

FIG. 8 shows a perspective view of an illustrative embodiment of a photodetector 800 having nano-assemblies spaced apart from SP waveguides. Photodetector 800 includes three nano-assemblies 132, 134 and 136 and four SP waveguides 142, 144, 146 and 148. SP waveguides 144 and 146 may be interposed between nano-assemblies 132, 134 and 136 to create an alternating arrangement of nano-assemblies 132, 134 and 136 and SP waveguides 144 and 146. Further, drains 162, 164 and 166 are separately arranged for each of nano-assemblies 132, 134 and 136. In one embodiment, each of drains 162, 164 and 166 may be connected to different external circuits (not shown) so that a predetermined current through each of nano-assemblies 132, 134 and 136 is detected in the respective external circuits (not shown). In one embodiment, nano-assemblies 132, 134 and 136 may each include different nano-materials, respectively. For example, nano-assemblies 132, 134 and 136 may include $Cd_xZn_{1-x}S$ ($0.5 \leq x \leq 1.0$), $CdSe_xS_{1-x}$ ($0 \leq x \leq 0.4$), and $CdSe_xS_{1-x}$ ($0.6 \leq x \leq 1.0$), respectively. In this case, photodetector 800 may be suitable for detecting different color spectrums such as blue, green, or red spectrum light.

Figure 9:
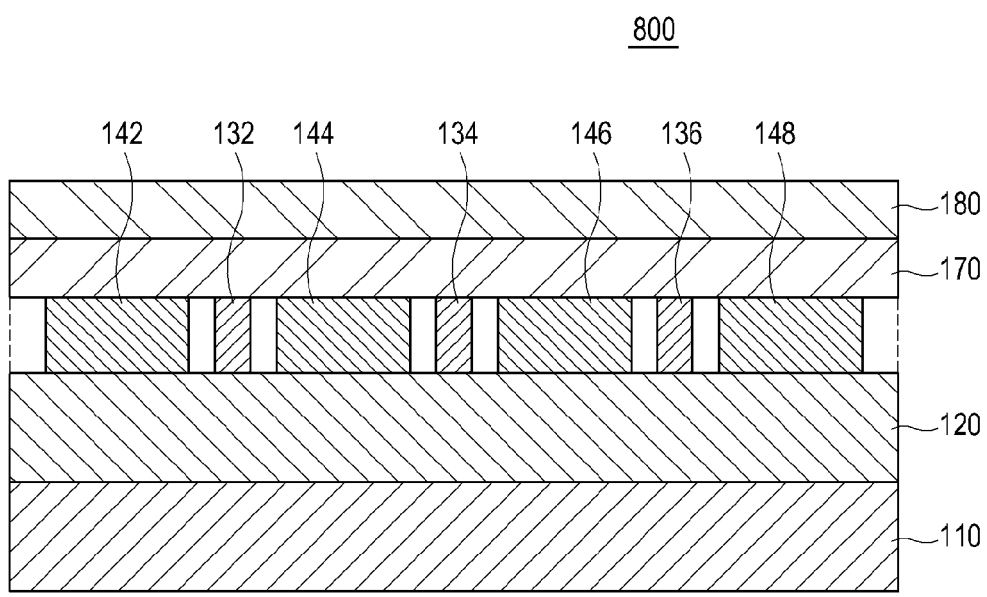
FIG. 9 shows a cross-sectional view of the illustrative embodiment of the photodetector shown in FIG. 8.

FIG. 9 shows a cross-sectional view of photodetector 800, which is taken along line A-A' in FIG. 8. Referring to FIG. 9, photodetector 800 has a laminated structure in which substrate 110, insulation layer 120, nano-assemblies 132, 134, and 136 (or SP waveguides 142, 144, 146, and 148), insulation layer 170 and transparent gate 180 are sequentially stacked. Substrate 110, insulation layers 120 and 170, source 150 and drain 160 may include the same materials as used in FIG. 7. While nano-assemblies 132, 134 and 136 may include nano-materials such as CdSe, CdS, ZnS, MgSe, or ZnS, SP waveguides 140 and transparent gate 180 may include any type of metal material including Ag, Al, Au, Ni, or Ti. In FIG. 9, nano-assemblies 132, 134 and 136 are arranged alternatingly with SP waveguides 142, 144, 146 and 148 on insulation layer 120 so that each of nano-assemblies 132, 134 and 136 is spaced apart from respective adjacent SP waveguides 142, 144, 146 and 148.

Figure 10:
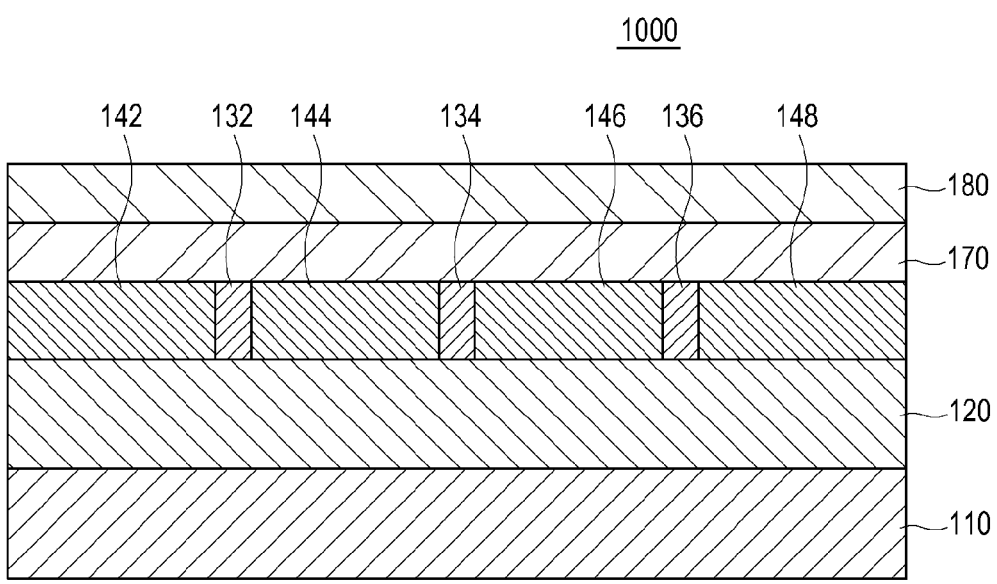
FIG. 10 shows a cross-sectional view of another illustrative embodiment of a photodetector having nano-assemblies placed in contact with SP waveguides.

FIG. 10 shows a cross-sectional view of an illustrative embodiment of a photodetector 1000 having nano-assemblies placed in contact with SP waveguides. Referring to FIG. 10, photodetector 1000 includes nano-assemblies 132, 134 and 136 arranged alternatingly and placed into contact with SP waveguides 142, 144, 146 and 148. The alternating arrangement of nano-assemblies 132, 134 and 136 and SP waveguides 142, 144, 146 and 148 as shown in FIG. 10 provides an interface to receive incident light where dielectric media is sandwiched between metal materials.

Figure 11:
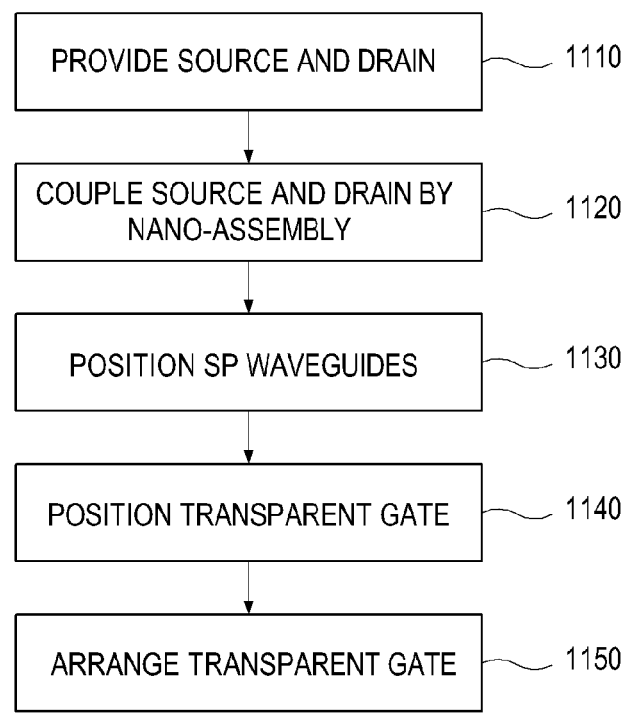
FIG. 11 shows a flow diagram of an illustrative embodiment of a method for providing a photodetector that detects the visible light spectrum.

FIG. 11 illustrates a flow diagram of an illustrative embodiment of a method for providing a photodetector that detects the visible light spectrum. In block 1110, a source and a drain are provided and may be fabricated using any of a variety of well-known fabrication techniques such as chemical vapor deposition, photolithographic, or etching techniques. In block 1120, the source and the drain are coupled by at least one nano-assembly, which may be grown between the source and the drain using any of a variety of suitable techniques such as epitaxial growth techniques or amorphously deposited by any suitable deposition technique. Illustrative techniques for applying the coatings include molecular beam epitaxy (MBE), metal-organic chemical vapor deposition (MOCVD), chemical vapor deposition (CVD) or plasma enhanced CVD (PECVD).

In block 1130, SP waveguides may be provided and positioned to be juxtaposed to the nano-assembly in a longitudinal direction of nano-assembly so that one SP waveguide is positioned along a first side of nano-assembly and another SP waveguide is positioned along a second side of nano-assembly that is opposite the first side.

Figure 12:
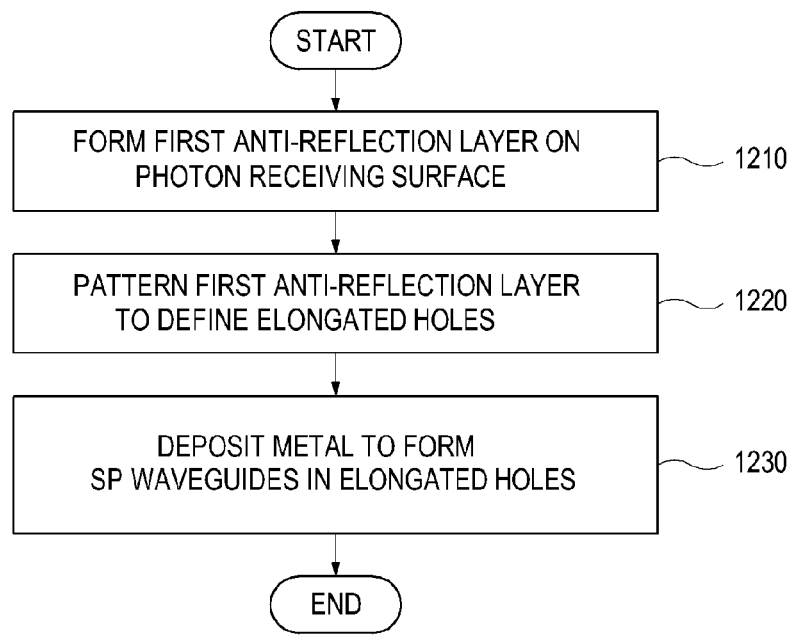
FIG. 12 shows a flow diagram of an illustrative embodiment of a method for providing SP waveguides.
Figure 13A:
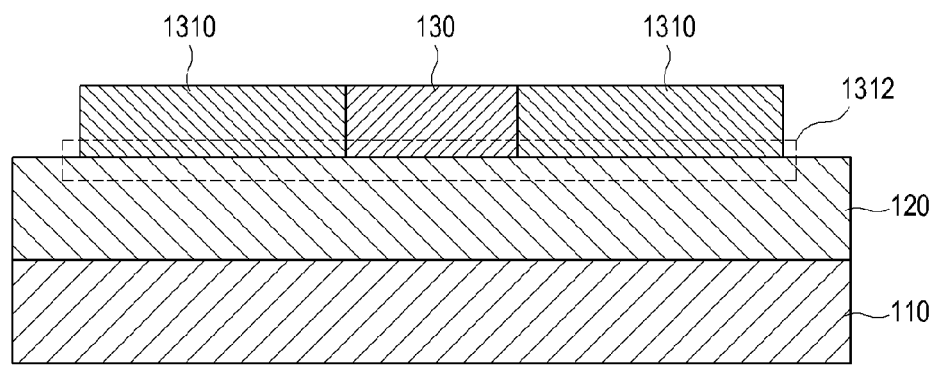
FIG. 13A-13C are a series of diagrams illustrating the method shown in FIG. 12.
Figure 13B:
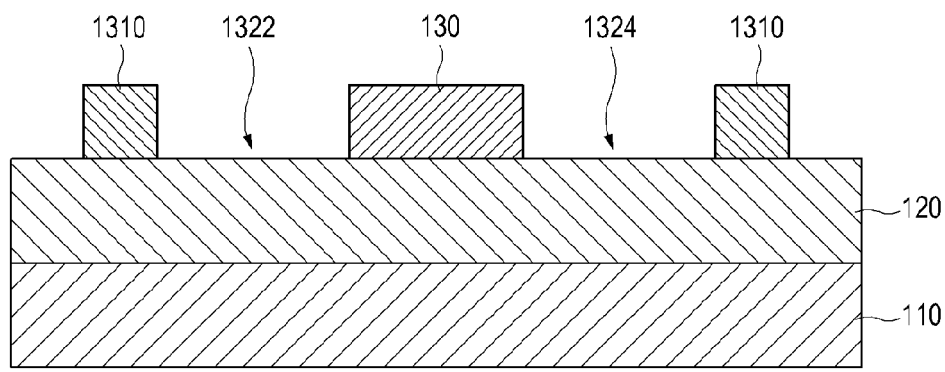
Figure 13C:
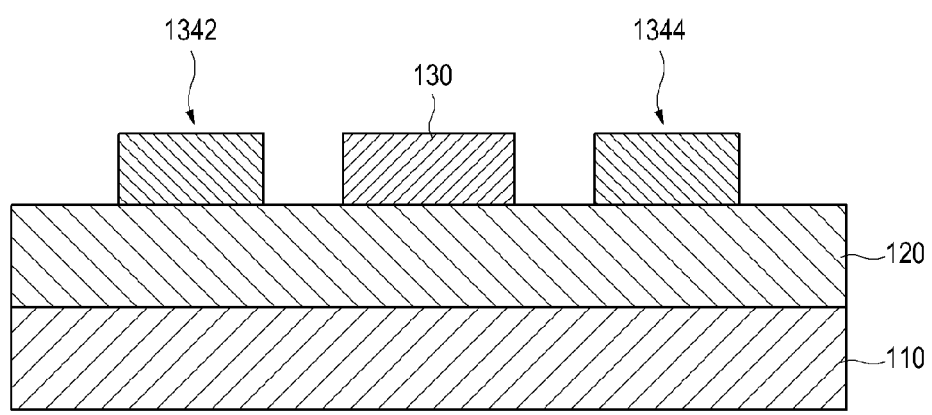

FIG. 12 is a flow diagram of an illustrative embodiment of a method for providing SP waveguides. FIGS. 13A-13C are a series of diagrams illustrating the method shown in FIG. 12. Referring to FIG. 12, in block 1210, as shown in FIG. 13A, a first anti-reflection layer 1310 is formed on a photon receiving surface 1312 on insulation layer 120. In one embodiment, photon receiving surface 1312 may be a portion of the top surface of insulation layer 120. In block 1220, as shown in FIG. 13B, first anti-reflection layer 1310 is patterned to define two elongated holes 1322 and 1324 therein. For example, first anti-reflection layer 1310 may be patterned by first forming a photo mask with patterns corresponding to two elongated holes 1322 and 1324, etching first anti-reflection layer 1110, and then removing the photo mask. First anti-reflection layer 1310 remaining in FIG. 13B may be removed at an appropriate time by suitable methods including etching. In block 1230, as shown in FIG. 13C, metal is deposited into two elongated holes 1322 and 1324 (shown in FIG. 13B) to respectively form two SP waveguides 1342 and 1344 therein. Such deposition may be performed, for example, by using any of a variety of suitable masking and deposition techniques known in the art. SP waveguides 1342 and 1344 may be obtained by using any of a variety of well-known techniques such as metal etching.

Referring again to FIG. 11, after positioning the SP waveguides, in block 1140, a transparent gate may be positioned above or substantially on top of the nano-assembly and at least two SP waveguides. In an illustrative embodiment, prior to positioning the transparent gate, an insulation layer may be placed on the nano-assembly and the SP waveguides. In block 1150, the transparent gate is further arranged to be in proximity to at least one nano-assembly and at least two SP waveguides so as to extend substantially parallel to at least one of the source and the drain.

It should be appreciated that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, it should be appreciated that these terms translate from the plural to the singular and/or from the singular to the plural as is appropriate to the context and/or application. The various singular/plural permutations may be expressly set forth herein for sake of clarity.

It should be further appreciated that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It should be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, it should be recognized that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one would understand the convention (e.g., "a system having at least one of A, B, or C" would include but not be limited to systems that have A alone, B alone, C alone, A and B together, A and C together, B and C together, and/or A, B, and C together, etc.). It should be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, it is recognized that the disclosure is also thereby described in terms of any individual member or subgroup of members of the Markush group.

It should be further understood, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. It should also be understood that all language such as "up to," "at least," and the like include the number recited and refer to ranges which can be subsequently broken down into subranges as discussed above. Finally, it should also be understood that a range includes each individual member. Thus, for example, a group having 1-3 cells refers to groups having 1, 2, or 3 cells. Similarly, a group having 1-5 cells refers to groups having 1, 2, 3, 4, or 5 cells, and so forth. From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A method to assemble a photodetector capable to detect visible light spectrum, the method comprising:
    providing a source and a drain;
    coupling the source and the drain with at least one nano-assembly;
    positioning at least two surface plasmon waveguides between the source and the drain and juxtaposing to the at least one nano-assembly in a longitudinal direction of the at least one nano-assembly;
    positioning a transparent gate in proximity to the at least one nano-assembly and the at least two surface plasmon waveguides; and
    arranging the transparent gate so as to extend substantially parallel to at least one of the source and the drain,
    wherein one of the at least two surface plasmon waveguides is positioned along a first side of the at least one nano-assembly, and another of the at least two surface plasmon waveguides is positioned along a second side of the at least one nano-assembly that is opposite the first side.

2. The method according to claim 1, wherein arranging the transparent gate includes:
    arranging the transparent gate between the source and drain.

3. The method according to claim 1, wherein providing the source includes:
    arranging the source at a proximal end of the photodetector.

4. The method according to claim 1, wherein providing the drain includes:
    arranging the drain at a distal end of the photodetector.

5. The method according to claim 1, further comprising:
    providing a dielectric material in a space between the at least one nano-assembly and one of the at least two surface plasmon waveguides.

6. The method according to claim 1, further comprising:
    providing an insulation layer between the at least one nano-assembly and the transparent gate.

7. The method according to claim 6, further comprising:
    providing one or more supporting members configured to arrange the transparent gate and the insulation layer above the at least one nano-assembly.

8. The method according to claim 1, further comprising:
    providing one or more supporting members configured to arrange the transparent gate above the at least one nano-assembly.

9. The method according to claim 1, wherein positioning the transparent gate in proximity to the at least one nano-assembly includes:
    arranging the transparent gate substantially perpendicular with respect to the at least one nano-assembly.

10. The method according to claim 1, further comprising:
    arranging at least one of the at least two surface plasmon waveguides to be in contact with the at least one nano-assembly.

11. The method according to claim 1, further comprising:
    providing a plurality of surface plasmon waveguides and nano-assemblies disposed so that at least some of the at least two surface plasmon waveguides are interposed between the nano-assemblies to create an alternating arrangement of the surface plasmon waveguides and the nano-assemblies.

12. The method according to claim 1, wherein the nano-assembly is configured to have a valence band and a conduction band such that at least one transition of electrons from the valence band to the conduction band corresponds to a detection of a photon.

13. A method to operate a photodetector capable to detect visible light spectrum, the method comprising:
    providing the photodetector including:
        a source and a drain;
        at least one nano-assembly coupled to the source and the drain;

at least two surface plasmon waveguides between the source and the drain and juxtaposed to the at least one nano-assembly in a longitudinal direction of the at least one nano-assembly; and a transparent gate in proximity to the at least one nano-assembly and the at least two surface plasmon waveguides;

irradiating the at least one nano-assembly with photons of light to cause an electric current to flow in the photodetector; and confining an electric field, created by the irradiated photons of the light, to the at least one nano-assembly by the at least two surface plasmon waves.

14. The method according to claim 13, wherein providing the transparent gate reduces spontaneous polarization created by the irradiated photons of light.

15. The method according to claim 13, wherein the irradiated photons of light cause electrons in a valence band of the at least one nano-assembly to transition to a conduction band of the at least one nano-assembly.

16. The method according to claim 13, wherein the photodetector is configured to perform detection on a plurality of spectrum detections.

17. The method according to claim 13, further comprising: arranging the transparent gate substantially perpendicular with respect to the at least one nano-assembly.

18. The method according to claim 13, further comprising: arranging at least one of the at least two surface plasmon waveguides to be in contact with the at least one nano-assembly.

19. A method to assemble a photodetector capable to detect visible light spectrum, the method comprising:

providing a first nano-assembly configured to perform a first spectrum detection;

providing a second nano-assembly configured to perform a second spectrum detection;

providing a third nano-assembly configured to perform a third spectrum detection;

coupling a source to a drain by the first, second and the third nano-assemblies;

providing at least two surface plasmon waveguides positioned between the source and the drain and juxtaposed to at least one of the nano-assemblies in a longitudinal direction of the at least one nano-assembly; and providing a transparent gate positioned in proximity to the at least one nano-assembly and the at least two surface plasmon waveguides, and further being arranged to extend substantially parallel to at least one of the source and the drain, wherein one of the at least two surface plasmon waveguides is positioned along a first side of the at least one nano-assembly, and another of the at least two surface plasmon waveguides is positioned along a second side of the at least one nano-assembly that is opposite the first side.

20. The method according to claim 19, wherein the first spectrum detection performed by the first nano-assembly detects blue light, the second spectrum detection performed by the second nano-assembly detects green light, and the third spectrum detection performed by the third nano-assembly detects red light.

* * * * *

UNITED STATES PATENT AND TRADEMARK OFFICE
CERTIFICATE OF CORRECTION

PATENT NO. : 8,802,481 B2
APPLICATION NO. : 13/485241
DATED : August 12, 2014
INVENTOR(S) : Ahn Page 1 of 2

It is certified that error appears in the above-identified patent and that said Letters Patent is hereby corrected as shown below:

Title page, References Cited

On Page 2, item (56), under "OTHER PUBLICATIONS", in Column 2, Line 16, delete "Nanothecnology." and insert -- Nanotechnology. --, therefor.

On Page 2, item (56), under "OTHER PUBLICATIONS", in Column 2, Line 32, delete "instrasubband" and insert -- intrasubband --, therefor.

On Page 2, item (56), under "OTHER PUBLICATIONS", in Column 2, Line 37, delete "Institue" and insert -- Institute --, therefor.

On Page 2, item (56), under "OTHER PUBLICATIONS", in Column 2, Line 41, delete "et al" and insert -- et al. --, therefor.

On Page 3, item (56), under "OTHER PUBLICATIONS", in Column 1, Line 3, delete "et al" and insert -- et al. --, therefor.

On Page 3, item (56), under "OTHER PUBLICATIONS", in Column 1, Line 6, delete "et al," and insert -- et al., --, therefor.

On Page 3, item (56), under "OTHER PUBLICATIONS", in Column 1, Line 58, delete "Polaritzation"," and insert -- Polarization", --, therefor.

On Page 3, item (56), under "OTHER PUBLICATIONS", in Column 2, Line 5, delete "stuctures" and insert -- structures --, therefor.

On Page 3, item (56), under "OTHER PUBLICATIONS", in Column 2, Line 33, delete "AiGan/" and insert -- AlGaN/ --, therefor.

Signed and Sealed this
Sixth Day of January, 2015

Michelle K. Lee
*Deputy Director of the United States Patent and Trademark Office*

CERTIFICATE OF CORRECTION (continued)
U.S. Pat. No. 8,802,481 B2

On Page 3, item (56), under "OTHER PUBLICATIONS", in Column 2, Line 37, delete "Photocoltaic" and insert -- Photovoltaic --, therefor.

On Page 3, item (56), under "OTHER PUBLICATIONS", in Column 2, Line 42, delete "et al," and insert -- et al., --, therefor.

On Page 4, item (56), under "OTHER PUBLICATIONS", in Column 1, Line 13, delete "et al," and insert -- et al., --, therefor.

In the Specification

In Column 2, Line 23, delete "FIG." and insert -- FIGS. --, therefor.